United States Patent
Kashyap et al.

(10) Patent No.: US 11,586,789 B2
(45) Date of Patent: Feb. 21, 2023

(54) MACHINE LEARNING BASED SMART PROCESS RECIPE BUILDER TO IMPROVE AZIMUTHAL FLOW AND THICKNESS UNIFORMITY

(71) Applicant: Applied Materials, Inc., Santa Clara, CA (US)

(72) Inventors: Dhritiman Subha Kashyap, Bangalore (IN); Chaowei Wang, San Jose, CA (US); Kartik Shah, Saratoga, CA (US); Kevin Griffin, Livermore, CA (US); Karthik Ramanathan, Bangalore (IN); Hanhong Chen, Milpitas, CA (US); Joseph AuBuchon, San Jose, CA (US); Sanjeev Baluja, Campbell, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 162 days.

(21) Appl. No.: 17/224,545

(22) Filed: Apr. 7, 2021

(65) Prior Publication Data
US 2022/0327262 A1 Oct. 13, 2022

(51) Int. Cl.
*G06F 30/27* (2020.01)
*G06F 30/10* (2020.01)

(52) U.S. Cl.
CPC .............. *G06F 30/27* (2020.01); *G06F 30/10* (2020.01)

(58) Field of Classification Search
CPC .................................. G06F 30/27; G06F 30/10
See application file for complete search history.

(56) References Cited

U.S. PATENT DOCUMENTS

| | | | |
|---|---|---|---|
| 7,302,363 B2 * | 11/2007 | Kaushal | G05B 23/0254 702/183 |
| 7,838,072 B2 * | 11/2010 | Kaushal | C23C 16/52 427/255.6 |
| 2019/0257767 A1 | 8/2019 | Shaubi et al. | |
| 2019/0286075 A1 | 9/2019 | Yennie et al. | |
| 2021/0090251 A1 | 3/2021 | Jha et al. | |

(Continued)

FOREIGN PATENT DOCUMENTS

| | | |
|---|---|---|
| JP | 2020043270 A | 3/2020 |
| WO | 2020205339 A1 | 10/2020 |

OTHER PUBLICATIONS

Lu, G., et al. "Integrated Dynamic Simulation of Rapid Thermal Chemical Vapor Deposition of Polysilicon" IEEE Transactions on Semiconductor Manufacturing, vol. 11, No. 1, pp. 63-74 (1998) (Year: 1998).*

(Continued)

*Primary Examiner* — Jay Hann
(74) *Attorney, Agent, or Firm* — Servilla Whitney LLC

(57) ABSTRACT

Methods, software systems and processes to develop surrogate model-based optimizers for controlling and optimizing flow and pressure of purges between a showerhead and a heater having a substrate support to control non-uniformity inherent in a processing chamber due to geometric configuration and process regimes. The flow optimizer process utilizes experimental data from optimal process space coverage models, generated simulation data and statistical machine learning tools (i.e. regression models and global optimizers) to predict optimal flow rates for any user-specified process regime.

13 Claims, 7 Drawing Sheets

(56) References Cited

U.S. PATENT DOCUMENTS

2022/0298632 A1* 9/2022 Shaikh .............. C23C 16/45521
2022/0344184 A1* 10/2022 Sadeghi ............ H01J 37/32642

OTHER PUBLICATIONS

PCT International Search Report and Written Opinion in PCT/US2022/023591 dated Jul. 28, 2022, 10 pages.
U.S. Appl. No. 16/944,012, filed Jul. 30, 2020, 51 pages.
U.S. Appl. No. 17/019,061, filed Sep. 11, 2020, 52 pages.

* cited by examiner

MACHINE LEARNING BASED SMART PROCESS RECIPE BUILDER TO IMPROVE AZIMUTHAL FLOW AND THICKNESS UNIFORMITY

TECHNICAL FIELD

Embodiments of the disclosure generally relate to methods and systems for improving azimuthal flow and thickness uniformity by utilizing a surrogate model-based optimizer for determining and controlling flow and pressure parameters of non-concentric purges of one or more processing stations of a processing chamber. In particular, embodiments of the disclosure relate to methods, systems and processes of a smart process recipe builder for determining and controlling non-concentric flow rates and pressure parameters of purges between one or more processing stations of a processing chamber.

BACKGROUND

Chemical vapor deposition (CVD) is one type deposition processes employed for depositing layers on a substrate. Physics Vapor Deposition (PVD) is another type of deposition process in which the precursor goes from a condensed phase to a vapor phase and then back to a thin film condensed phase. Atomic layer deposition (ALD), which is also referred to as cyclical deposition, employs chemisorption techniques to deliver precursor molecules on a substrate surface in sequential cycles. Such deposition processes occur within one or more conventional processing stations of a processing chamber, and the process parameters of each of the one or more stations are controlled by a specific process recipe for the station, while chamber parameters are across the entire chamber.

Conventional processing stations comprise a showerhead in contact with a support assembly and a housing forming a processing volume in which deposition on a substrate occurs. Each of the processing stations has a main throttle valve to control the flow rates and pressure of gases in and out of each processing station. The main throttle valve is connected to one or more concentric purge rings or purge regions through a gas plenum which extends around the processing station. By way of example, concentric purge rings or locations are positioned within a substrate support of the heater, within the showerhead or around and concentric to the processing station. The pressure and flow rate parameters of these concentric purge regions are controlled by a process recipe for the station and are specific to the deposition process occurring within the station. However, each processing station within a processing chamber may not be occurring at the same time, or may not all be the same process.

To isolate one station from another, or to control parameters of the environment between stations, the processing chamber also has one or more purge regions which are nonconcentric to the processing station. These non-concentric purge regions are not controlled by the specific process recipe within each processing station, and thus where different processes are occurring within each station, the substrate layering uniformity and azimuthal uniformity in deposition of each station are affected.

Thus, there exists a need to control the parameters of the non-concentric purge regions to maintain effective separation and prevent mixing of different processing station gases while improving azimuthal uniformity and reducing thermal non-uniformity. Furthermore, there exists a need to determine pressure variation of purges on the substrate during process for different flow rates.

SUMMARY

One or more embodiment of the disclosure are directed to methods for building a surrogate model-based optimizer. A simulation model is built using one or more of a detailed physics models or chamber geometry. The simulation model is calibrated against one or more of chamber level data or experimental data. The simulation parameters and validating simulation parameters are calibrated against measured data. Design of experiment parameters are created to cover optimal process space parameters. A validated simulation model is executed for the design of experiments parameters. A surrogate model is built based on simulation data through machine learning techniques.

Additional embodiments of the disclosure are directed to computer program products comprising computer executable code embodied in a non-transitory computer readable medium that, when executing on one or more computing devices, performs the steps of: processing inputs through a surrogate model to generate process parameters, the surrogate model determined for a target process recipe; processing inputs through a physics-based model to generate a surrogate model; comparing the chamber-specific data with experimental data using inputs to determine a theoretical physics model; determining if the chamber-specific data or experimental data matches the theoretical physics model and generating a calibrated physics model; and calculating optimized values for one or more purge regions of a processing station.

Further embodiments of the disclosure are directed to methods for determining process parameters. A simulation model is built using one or more of a detailed physics models or chamber geometry. The simulation model is calibrated against one or more of chamber level data or experimental data. Simulation parameters and validating simulation parameters are calibrated against measured data. The measured data including inputs from one or more of flow rate sensors or pressure sensors of one or more purge regions or station sensors. Design of experiment parameters are created to cover optimal process space parameters. A validated simulation model is executed for the design of experiments parameters. A surrogate model is built based on simulation data through machine learning techniques. A signal from one or more of the flow rate sensors or one or more of the pressure sensors is processed through the surrogate model to calibrate one or more of pressure or flow values to output one or more of an optimized purge flow or pressure parameter for one or more purge regions. One or more of a differential pressure between a substrate and one or more throttle valves, a recipe pressure setting at one or more of the throttle valves, or a substrate pressure contour map output is generated.

DETAILED DESCRIPTION

Figure 1:
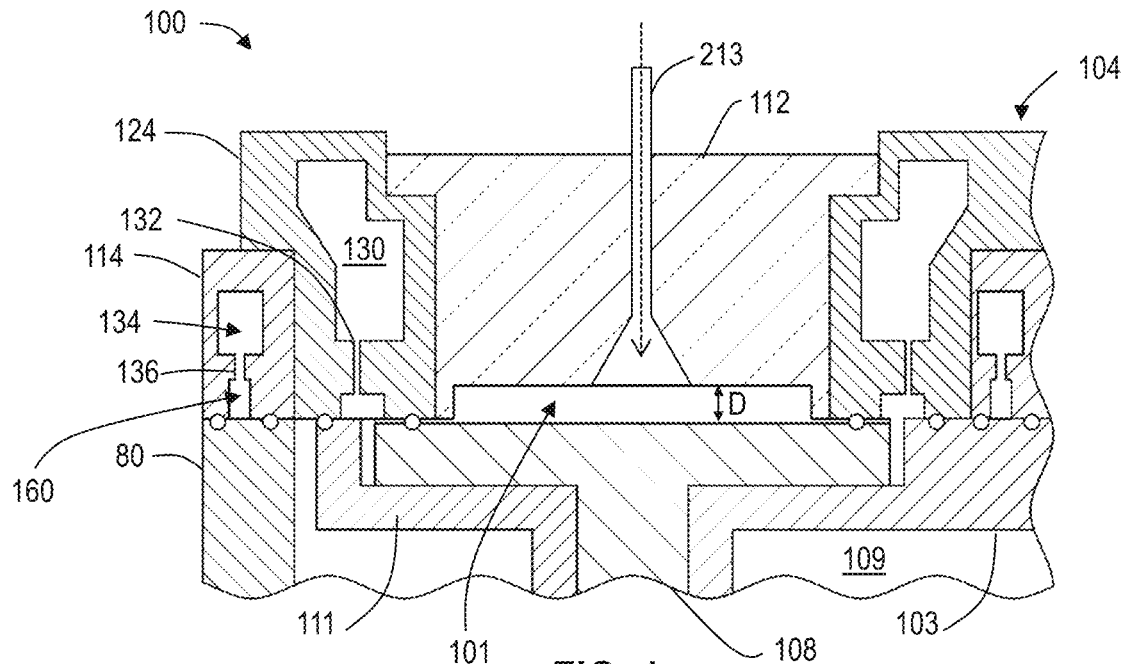
FIG. 1 shows a cross-sectional view of a processing chamber in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

A "concentric purge" or "concentric purge region" as used herein refers to a purge which is concentric to a processing station. These include, but are not limited to, a heater purge and a separation purge.

A "nonconcentric purge" or "nonconcentric purge region" as used herein refers to a purge which is not concentric to a processing station, and is arranged around a processing chamber. These include, but are not limited to, an angle purge , center purge and a bottom purge.

As used herein, the terms "back end" and "back-end" refer to aspects of the disclosure which include building and forming the surrogate model-based optimizer. Essentially, the terms refer to aspects of a computer application and the system and methods of the present disclosure that allow it to operate and that cannot be accessed by a user. The terms "front end" and "front-end" refer to aspects of the disclosure which include use of and interaction with the surrogate model-based optimizer by an end user, preferably through a graphical user interface or through real-time sensor or system inputs.

With reference to the figures as set forth below, a linear arrangement is depicted, however any suitable layout of components and handling hardware may be usefully employed according to a particular process design. Further, tools such as valves, gas delivery apparatuses, controllers, ampoules and the like may be employed, along with sensors (such as pressure sensors, optical sensors, contamination sensors, etc.), timers, switches, actuators, relays, motors, and so forth, may be suitably employed to control or monitor processes. All such variations are intended to fall within the scope of the systems described herein.

Embodiments of the disclosure generally relate to methods and systems for improving azimuthal flow and thickness uniformity by utilizing a surrogate model-based optimizer for determining and controlling flow and pressure parameters of non-concentric purges of one or more processing stations of a processing chamber. In particular, embodiments of the disclosure relate to methods, software systems, processes and surrogate model-based optimizers for a smart process recipe builder for determining and controlling non-concentric flow rates and pressure parameters of purges between one or more processing stations of a processing chamber.

Embodiments herein describe the use of sensors and controllers for providing an input for software systems, processes and surrogate model-based optimizers. However, said inputs can be provided by a user via, for example, a graphical user interface. In some embodiments, the user input can be readings or measurements from a processing station or more generally a processing chamber; however the user input can also be theoretical or experimental inputs for projecting outputs.

A system, method for a surrogate model-based optimizer is disclosed, in which the surrogate model-based optimizer is part of a smart recipe builder. The surrogate model-based optimizer is configured to determine optimized values from user provided parameters. At the back end, the smart recipe builder utilizes chamber geometries, system parameters and recipe parameters to build a simulation model with detailed physics models of said parameters and chamber geometry. The physics-based simulation model is calibrated against measured experimental data and a detailed design of experiments ("DOE") regime that adequately covers the process space. The physics-based simulation model is created using space filling, Latin hypercube or such similar algorithms. A validated simulation model derived from the physics-based simulation model is then run for the DOE parameters. Machine learning is utilized to create a hybrid model, where the hybrid model is configured to determine recipe settings in the process space of interest, also referred to as a surrogate model. In some embodiments, the models for each process are developed based on one or more of the following techniques: singular value decomposition (SVD), principal orthogonal decomposition (POD), gaussian process regression, ridge and/or other kernel based regressions, response surface based regression, neural network models, radial basis functions and regression models that account for spatial connectivity. Optimization routines such as multi-objective optimization routines using methods like Direct, Simplicial Homology Global Optimization (SHGO), Simplex, etc., are analyzed with the surrogate model data to determine process parameters to achieve a set target. The target can either be defined directly in the process or can be user-defined. Suitable optimization targets include, but are not limited to, deposition thickness uniformity, preventing cross-contamination, minimizing total flow, etc. The model also predicts real-time adjustments as required for system variation.

In some embodiments, the surrogate model-based optimizer is configured to determine and predict recipe pressure settings and wafer pressure values for a specified set of purge flows (also referred to as a "pressure predictor surrogate model-based optimizer") In some embodiments, the surrogate model-based optimizer is configured to determine and predict recipe flow settings for a specified set of purge flows (also referred to as a "flow predictor surrogate model-based optimizer" or "flow predictor").

On the back end, in some embodiments, a simulation model is built utilizing detailed physics and chamber geometry, which are calibrated against chamber level data through in-built and external sensors and other metrology. As used herein, the term "chamber level data" refers to sensor data, user inputs, metrology or target recipe parameters. The model of some embodiments is then validated based on Design of Experiments (DOE) and machine learning techniques to build a surrogate model-based on machine learning techniques.

On the front end of one or more embodiments, an end user can input parameters into a user interface of the surrogate model-based optimizer to predict recipe flow settings for a specified set of process parameters and to predict recipe pressure settings and wafer pressure values for a specified set of recipe flow settings.

The surrogate model-based optimizers described herein are built with data models created based on 3D computational fluid dynamics (3D CFD) simulations that are validated and calibrated with experimental measurements. A detailed design of experiments that adequately covers the process space is created using space filling, Latin hypercube or such similar algorithms. The validated 3D CFD simulation model is then run for the DOE parameters. This DOE data is then used to create the surrogate model using machine learning techniques.

In some embodiments, the methods and systems described herein utilize experimental data from optimal process space coverage models, generated simulation data and/or statistical tools (i.e. a regression based surrogate models and global optimizer) to predict optimal outputs for flow rate and pressure settings for non-concentric gas purge regions. In some embodiments, the methods and systems predict and determine differential pressures between the wafer and main throttle valve, recipe pressure setting for one or more throttle valves and a 3D modeled pressure contour map. In some embodiments, the methods and systems further generate a pressure profile and a velocity profile at a wafer edge. In some embodiments, this process is integrated into front-end software or a user interface for fault detection and correction of non-uniformity.

Some embodiments are directed to a method and system for the flow predictor surrogate model-based optimizer to control and determine flow rates of non-concentric processing station purge regions. In particular, the method and system receives one or more of the following as input parameters: the flow rate for each station, the flow rate of the heater purge, the flow of the separation purge, the process pressure and/or the process gap. The method and system of some embodiments outputs values for various purge flows based on the system configuration and process constraints. In some embodiments, the method and system outputs values for optimized angle purge, a center purge and a bottom purge. In some embodiments, the inputs are received via a graphical user interface or stored in memory. The method and system sends as outputs to a graphical user interface, a data storage or to a controller to control one or more of the flow and/or pressure in one or more non-concentric gas purge regions (angle purges, center purges and bottom purges). In some embodiments, this process is integrated into front-end software or a user interface. In some embodiments, the front-end software is configured to allow for fault detection and/or correction of non-uniformity.

Some embodiments are directed to a method for the pressure predictor surrogate model-based optimizer to predict and determine recipe pressure setting(s) at one or more individual throttle valves for each processing station in a batch processing chamber. The method of some embodiments receives as inputs one or more of: flow rate values for the separation purge, center purge, bottom purge, angle purge and heater purge, the process pressure, the process gap, the separation gap and/or the main station flow rate for each station. The method of some embodiments further includes processing as outputs a pressure profile on the substrate during substrate processing or deposition. In some embodiments, the process receives inputs for concentric purge valve flow and purge valve pressure and determines in real time the flow and pressure setting for each non-concentric pressures and flow at the individual throttle valve of each non-concentric purge valve relative to a processing station. Given said inputs, the method of some embodiments further predicts a 3D CFD model and pressure contour model on the wafer as a function of the process gap, flow rate for the station, and targeted process pressure for a process recipe. The method of some embodiments is used to determine, control, generate, optimize, validate and/or calibrate non-concentric recipe parameters and predict substrate uniformity. In some embodiments, this process is integrated into front-end software or a user interface for fault detection and/or correction of non-uniformity.

Figure 2:
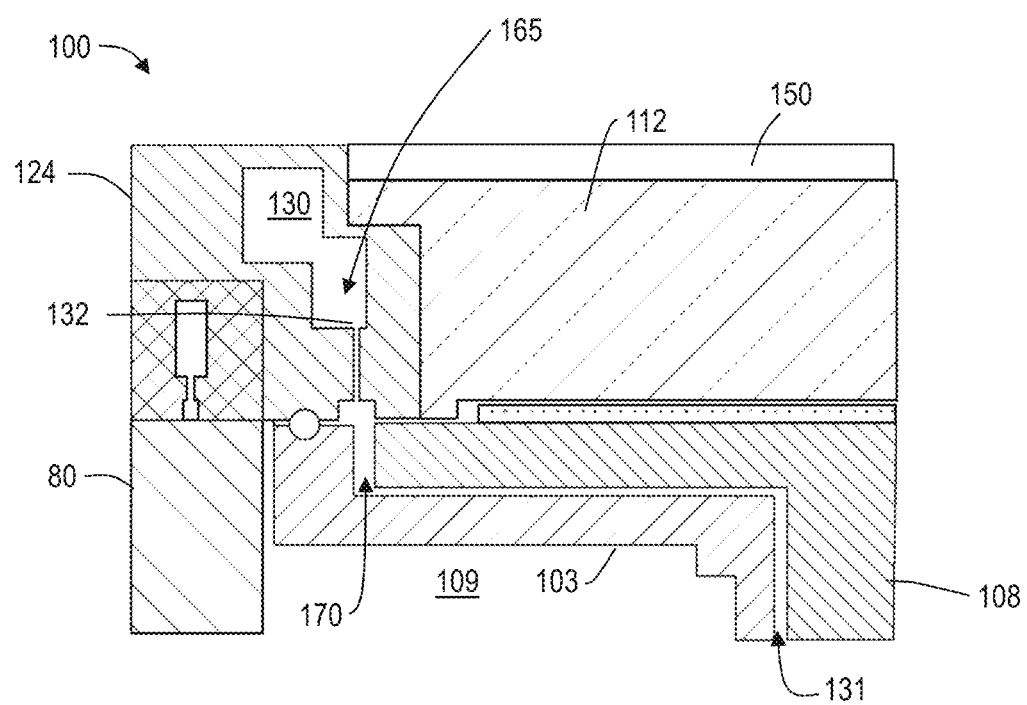
FIG. 2 shows a cross-sectional view of a processing chamber in accordance with one or more embodiment of the disclosure.
Figure 3:
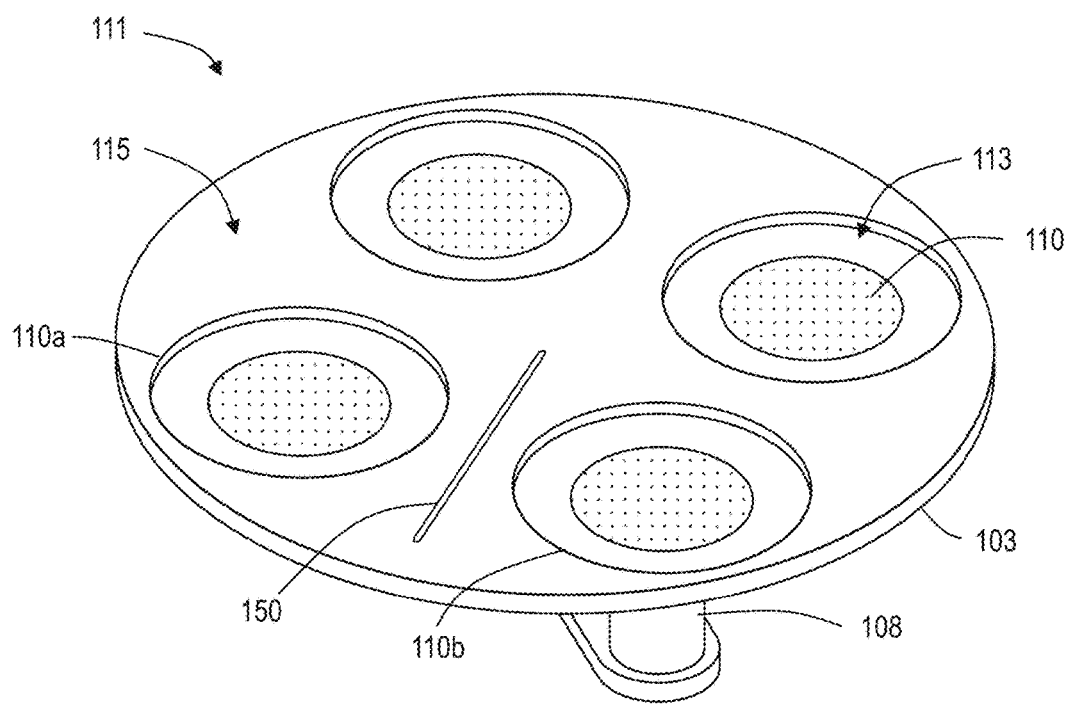
FIG. 3 shows a top parallel projection view of a support assembly in accordance with one or more embodiment of the disclosure.
Figure 4:
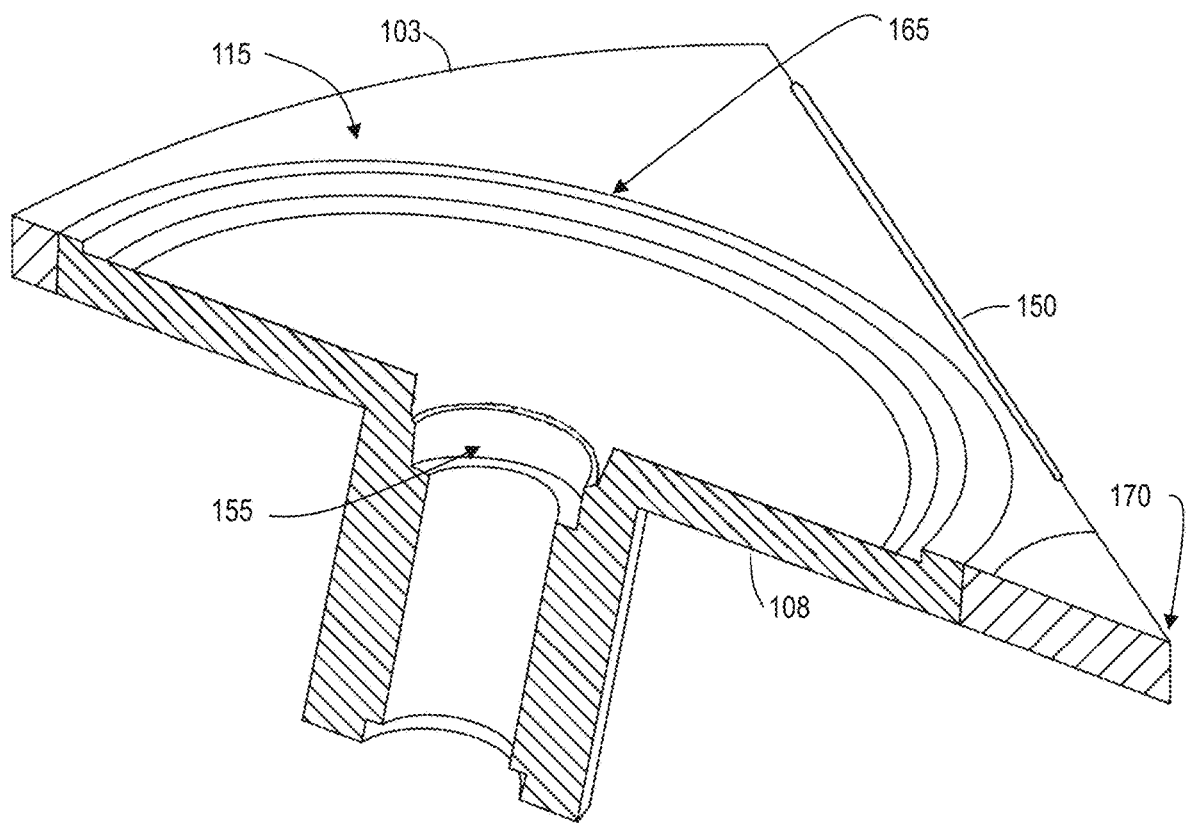
FIG. 4 shows a cross-sectional view of a portion of a support plate and a heater in accordance with one or more embodiment of the disclosure.

FIGS. 1 through 4 illustrate conventional processing stations 104 of a processing chambers 100 in accordance with one or more embodiments of the disclosure. FIGS. 1 and 2 illustrate cross-sectional views of embodiments of the processing station 104. FIG. 3 illustrates a top isometric view of a substrate support 111 with a support plate 103. FIG. 4 illustrates a cross-sectional view of a portion of a substrate support 111 with a support plate 103.

The processing station 104 comprises a pump/purge insert 124 and a gas injector 116. The gas injector includes one or more spray nozzles (not shown) connected to a gas injector inlet 213. The gas injector inlet 213 The processing station 104 is positioned over and in contact with a heater 108 and a support plate 103 forming a processing volume 101. The heater 108 of some embodiments includes a support surface configured to support a substrate during processing. The housing 80 and processing station 104 enclose an interior volume 109 of the processing chamber 100. The substrate support 111 is located within the interior volume 109.

In some embodiments, the pump/purge insert 124 is connected to or in fluid communication with a vacuum (exhaust). In some embodiments, the pump/purge insert 124 is connected to or in fluid communication with a purge gas source. Likewise, in some embodiments, the substrate support 111 comprises internal channels connected to or in fluid communication with a vacuum (exhaust) or a purge gas source.

The pump/purge insert 124 of some embodiments includes an inner gas plenum 130 with at least one opening 132 in the bottom of the pump/purge insert 124. The inner gas plenum 130 has an inlet (not shown), typically near the top or sidewall of the pump/purge insert 124. In some embodiments, the inner gas plenum 130 can be charged with a purge or inert gas which can pass through the opening 132 in the bottom of the pump/purge insert 124. The gas flow through the opening 132 can help create a gas curtain type barrier to prevent leakage of process gases from the interior of the processing chamber. In some embodiments, the inner gas plenum 130 is connected to or in fluid communication with a vacuum source. In such an embodiment, gases flow through the opening 132 in the bottom of the pump/purge insert 124 into the inner gas plenum 130. The gases can be evacuated from the plenum to exhaust. Such arrange can be used to evacuate gases from the process station 112 during use and help prevent process gases from migrating from the processing volume 101 to the interior volume 109 of the processing chamber 100.

In some embodiments, the top plate 114 includes an outer gas plenum 134 in fluid communication with a purge gas port 136 at the outer boundary of the process stations 104. The purge gas port 136 and purge outer gas plenum 134 and the vacuum port (opening 132) can extend around the perimeter of the process station 112 to form a gas curtain. The gas curtain can help minimize or eliminate leakage of process gases from the processing volume 101 into the interior volume 102 of the processing chamber 100.

The support plate 103, as shown in FIGS. 3 and 4, is a single component, or grouping of contacting components, that surrounds all of the heaters 108 with a plurality of openings 113 to allow access to the support surface 110 of the heaters 108. The openings 113 can allow the heaters 108 to pass through the support plate 103. In some embodiments, the support plate 103 is fixed so that the support plate 103 moves vertically and rotates with the heaters 108.

In one or more embodiments, the support plate 103 is a disc-shaped component with a top surface 115 configured to support a plurality of substrates. The top surface 115 has a plurality of recesses sized to support one or more substrates during processing. In some embodiments, the recesses have a depth equal to about the thickness of the substrates to be processed so that the top surface of the substrates are substantially coplanar with the top surface 115 of the support plate 103.

One or more vacuum streams and/or purge gas streams can be used to isolate one or more components of the processing station 112 from one another, to isolate a processing station 110a from an adjacent processing station 110b, to isolate a substrate from one or more components of the processing station 112 or to vacuum chuck the substrate.

In particular, an angle purge 150 show in FIG. 4 is configured to isolate a process station 110a to isolate from an adjacent process station 110b and comprises one or more vacuum streams and/or purge gas streams extending through the top surface 115 of the support plate 103. A heater purge 155 extends through a hollow conduit of the heater 108. The outer gas plenum 134 as previously described can be configured as a bottom purge 160. As shown in FIG. 2, the inner gas plenum 130 and a gap 131 between the heater 108 and the support plate 103 can form a separation purge 165. The gap 131 extends between the opening 113 of the support plate 103 and the heater 108 and between the recess 117 of the support plate 103 and the heater 108. As shown in FIG. 4, a center purge 170 can extend through the center of the support plate 103.

Each of the aforementioned purges are either concentric to each of the processing station or non-concentric to each of the processing stations. In particular, the heater purge 155, separation purge 165, and center purge 170 are concentric to the processing station and are all connected to a single throttle valve and gas supply for each station. Stated differently, in some embodiments, the concentric purges receive gas from a station flow supply.

Each of the aforementioned purges affect pumping uniformity around each processing station 112 which create flow skews during deposition on the substrate. Embodiments disclosed herein relate to methods, software systems, processes and surrogate model-based optimizers for controlling and optimizing flow and pressure of purges between a showerhead and a heater having a substrate support.

Embodiments are embodiments are directed to a method and system for controlling and determining pressure and flow rate parameters of non-concentric processing station purge regions optimization process to improve non-uniformity inherent in a processing chamber due to factors such as, but not limited to, geometric configuration and process regimes. The embodiments provide for methods and systems to control pressure spikes inside the chamber due to rapid changes in flow rates and enable pressure control based on wafer measurements. The embodiments determine recipe pressure setting at the throttle valve as a function of process gap size, flow rate, and process pressure. The embodiments are directed to software which calculates, optimizes and projects an optimal combination of purge flow and pressures for each of the purges described herein. The embodiments disclosed minimize azimuthal non-uniformity of velocity and pressure at different locations to a target of <2%, minimize precursor concentration at different locations to a target of <100 ppb, and minimize total flow inside the chamber.

Figure 5:
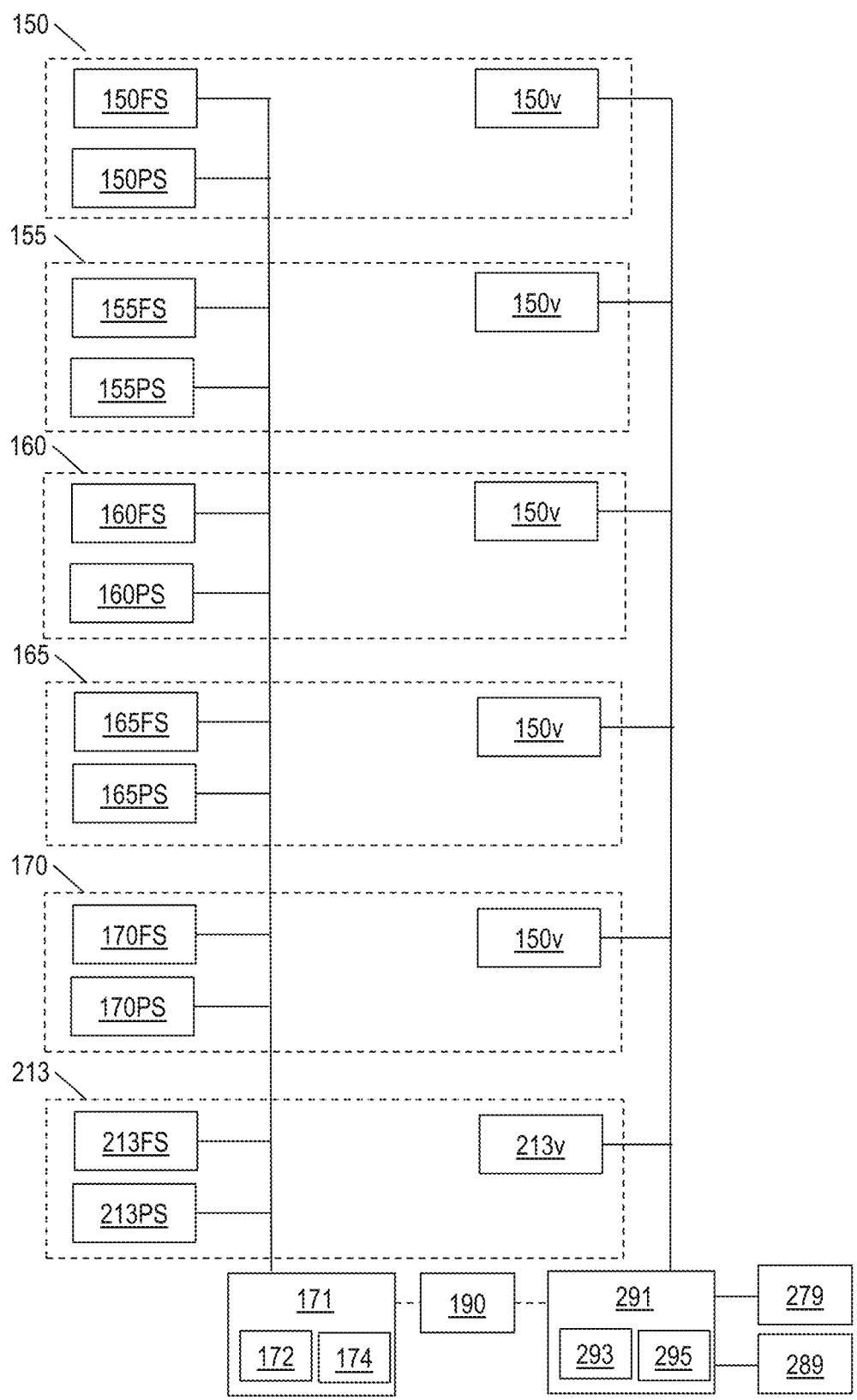
FIG. 5 shows a schematic representation of a throttle valve control system in accordance with one or more embodiment of the disclosure.

FIG. 5 shows a schematic representation of a throttle valve control system 200 for controlling flow rate sensors, pressure sensors and throttle valves of purge regions as described in further detail below. In some embodiments, the throttle valve control system 200 controls flow rate sensors and throttle valves of purge regions.

In some conventional processing chambers, there is only one dedicated throttle valve per processing station. In embodiments where there are four processing stations, each processing station has four throttle valves. Depending on the predetermined flow distribution across the various stations, the surrogate model-based optimizer can provide simulated pressure and flow values for each station that needs to be maintained by varying the other throttle valve positions. Stated differently, where the flow through a single throttle valve is known, the other throttle valve positions can be mechanically varied to match the simulated pressure and flow values predicted by the surrogate model-based optimizer. The predetermined flow per station can either be equal for all stations (total flow/number of stations) or unequal. Depending on the total flow within the chamber (i.e. the sum of all purges and station flows), the throttle valve position in each station is set such that predetermined flow per station is achieved. The predetermined flow per station can either be equal for all stations (total flow/number of stations) or unequal. The following embodiments disclose individual throttle valves for each purge region, however in embodiments having a single throttle valve per processing station, the control of the individual throttle valve is simulated, and thus can be modified by mechanically varying the flow distribution of the single throttle valve.

Furthermore, the following embodiments disclose that each purge region has a pressure sensor and a flow sensor, however, in embodiments where only one of the two sensors are present, the value for the other parameter can be calculated and simulated. Thus, in some embodiments, each purge region has only a purge sensor or a flow sensor, wherein the other is calculated and simulated.

As schematically represented in FIG. 5, each of the purge regions (angle purge 150, heater purge 155, bottom purge 160, separation purge 165 and center purge 170) have a flow rate sensor (angle purge flow rate sensor 150FS, heater purge flow rate sensor 155FS, bottom purge flow rate sensor 160FS, separation purge flow rate sensor 165FS and center purge flow rate sensor 170FS). In some embodiments, each of the purge regions (angle purge 150, heater purge 155, bottom purge 160, separation purge 165 and center purge 170) have a pressure sensor (angle purge pressure sensor 150PS, heater purge pressure sensor 155PS, bottom purge pressure sensor 160PS, separation purge pressure sensor 165PS and center purge pressure sensor 170PS). Each of the flow rate sensors (150FS, 155FS, 160FS 165FS, 170FS) and each of the pressure sensors (150PS, 155PS, 160PS 165PS, 170PS) are controlled by a sensor controller 171. In embodiments where more purge regions are monitored, each pressure and sensor of additional purge regions sensors are connected and controlled by the sensor controller 171. The sensor controller 171 is configured to send and receive pressure and flow data from one or more of the flow rate sensors and pressure sensors in real time to indicate the flow and/or pressure values through any one of the purge regions. In some embodiments, the sensor controller 171 is configured to send flow and pressure values as data to a throttle valve controller 291 as explained in further detail below. In some embodiments, the sensor controller 171 is connected to a station flow rate sensor 213FS positioned at the gas injector inlet 213 (as shown in FIG. 1), and a station pressure sensor 213PS positioned at the gas injector inlet 213 to measure the process pressure. In some embodiments, a station throttle valve 213v is connected to the throttle valve controller 291.

The sensor controller 171 according to one or more embodiments comprises a processor 172, a memory 174 coupled to the processor, input/output devices coupled to the sensor controller 171 and support circuits to provide communication between the different components of the system or apparatus, operation of the one or more of the flow rate sensors and/or pressure sensors. In some embodiments, the sensor controller 171 is in communication with the throttle valve controller 291 and is configured to send a single to the throttle valve controller 291.

As further shown in FIG. 5, each of the purge regions (angle purge 150, heater purge 155, bottom purge 160, separation purge 165 and center purge 170) further comprises a throttle valve (angle purge throttle valve 150v, heater purge throttle valve 155v, bottom purge bottom purge throttle valve 160v, separation purge throttle valve 165v and center purge throttle valve 170v) located outside of the processing station (not shown) and each throttle valve is connected to the throttle valve controller 291 which controls each throttle valve (150V, 160V, 165V, 170V). Further, the station throttle valve 213v is connected to the throttle valve controller 291.

The throttle valve controller 291 according to one or more embodiments comprises a processor 293, a memory 295 coupled to the processor, input/output devices coupled to the processor 293, and support circuits to provide communication between the different components of the system or apparatus and operation of the a throttle valves (angle purge throttle valve 150v, heater purge throttle valve 155v, bottom purge bottom purge throttle valve 160v, separation purge throttle valve 165v and center purge throttle valve 170v).

In some embodiments, the throttle valve controller 291 is configured to activate or deactivate one or more of an inert gas supply 279 and/or a precursor supply 289. In some embodiments, inert gas from the inert gas supply 279 is mixed with the precursor supply 289, both of which are supplied to the gas injector inlet 213 and are controlled by the station throttle valve 213v. In some embodiments, the precursor supply 289 is mixed with inert gas from an external source and is supplied to the gas injector inlet 213 and is controlled by the station throttle valve 213v. In some embodiments, the station flow rate sensor 213FS and a station pressure sensor 213PS are placed along the flow path of the gas injector inlet 213, and station throttle valve 213v regulates the supply of gas.

In some embodiments, the throttle valve controller 291 is configured to send a signal to the gas supply 279. The throttle valve controller 291 configured to increase or decrease the gas supply 279 and regulate the flow of the gas from the gas supply 279 to the throttle valves.

Processes to operate the throttle valve control system 200 may generally be stored in the memory of, for example, the sensor controller 171, the throttle valve controller 291 or other controller, as a software routine that, when executed by the processor, causes the throttle valve control system 200 to perform methods described in the present disclosure. The software routine may also be stored and/or executed by a second processor (not shown) that is remotely located from the hardware being controlled by the processor. Some or all of the methods of the present disclosure may also be performed by hardware. As such, the methods described in this disclosure are implemented in software and executed using a computer system, by hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

In some embodiments, the sensor controller 171 and the throttle valve controller 291 are a single controller having a processor and a memory coupled to the processor, input/output devices coupled to the processor, and support circuits to provide communication between the different components of the throttle valve control system 200.

Some or all of the methods of the present disclosure may also be performed by hardware. As such, the methods described in this disclosure are implemented in software and executed using a computer system, by hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

The memory 174 of the sensor controller 171 and the memory 294 of the throttle valve controller 291 of one or more embodiments includes one or more of transitory memory (e.g., random access memory) and/or non-transitory memory (e.g., storage) and the memory of the processor may be one or more of readily available memory such as random access memory (RAM), read-only memory (ROM), floppy disk, hard disk, or any other form of digital storage, local or remote. The memory can retain an instruction set that is operable by the processor to control parameters and components of the system. The support circuits are coupled to the processor for supporting the processor in a conventional manner. Circuits may include, for example, cache, power supplies, clock circuits, input/output circuitry, subsystems, and the like.

In one or more embodiments, the sensor controller 171 and the throttle valve controller 291 execute instructions to deliver a flow of inert gas from the gas supply 279 to the purge regions (150, 155, 160, 165, 170) through the throttle valves (150v, 155v, 160v, 165v, 170v, 175v). In some embodiments, the gas supply 279, throttle valves (150v, 155v, 160v, 165v, 170v, 175v) and purge regions (150, 155, 160, 165, 170) and the process station flow 175 are fluidly connected by conduits (not shown) or passageways between components as previously shown in FIGS. 1 through 4. In some embodiments, the sensor controller 171 and the throttle valve controller 291 execute instructions to deliver a flow of inert gas or precursor-mixed gas to the gas injector inlet 213 through the station throttle valve 213v.

The throttle valve control system 200, as shown in FIG. 5, further includes control software 190. The control software 190 performs a variety of tasks associated with controlling the throttle valve control system 200. By way of example and not limitation, the control software 190 may control operation of the sensor controller 191, the throttle valve controller 291 and one or more of the components of the throttle valve control system 200, including the throttle valves (150v, 155v, 160v, 165v, 170v, 213v), pressure sensors (150PS, 155PS, 160PS, 165PS, 170PS, 213PS) and/or flow rate sensors (150FS, 155FS, 160FS 165FS, 170FS, 213FS). Each of these hardware items may have a proprietary or open programming interface, and the control software 190 may also, or instead, manage communications with these hardware items, such as by interpreting data from the hardware or providing control signals to the hardware. At a more abstract level, the control software 190 may coordinate the various components of the throttle valve control system 200 to activate or de-activate components of the throttle valve control system 200, such as by coordinating and controlling operations of one or more of the pressure sensors (150PS, 155PS, 160PS, 165PS, 170PS, 213PS) and flow rate sensors (150FS, 155FS, 160FS 165FS, 170FS, 213PS) and/or throttle valves (150v, 155v, 160v, 165v, 170v, 213v). The control software 190 may also provide an external programmatic interface for controlling the throttle valve control system 200 and the throttle valves (150v, 155v, 160v, 165v, 170v, 213v) and flow of gas to the processing station 112, and may also, or instead, provide information to a wider computer infrastructure, such as event logs, status information, and the like. As will be described in greater detail below, the control software 190 may employ a surrogate model-based optimizer to calculate flow and pressure within the processing station 112 and to calculate optimized values as described in further detail below. The control software 190 may also provide a graphical user interface for user interaction with the throttle valve control system 200 and related process data. More generally, the control software 190 may support any software functions associated with status, monitoring, maintenance, evaluation, programming, control, and/or operation of the throttle valve control system 200, whether with respect to particular devices or components of the throttle valve control system 200 or the throttle valve control system 200 as a whole.

In some embodiments, the throttle valve control system 200 can be retrofit onto an existing or conventional processing station. Some embodiments are directed to an apparatus or a method that include the throttle valve control system 200 that is configured to be retrofit onto an existing or processing chamber 100. In the embodiments shown, the outlet is connected to a processing chamber 283 such as a film forming chamber into which precursor vapor entrained in a carrier gas is delivered for film deposition process. The processing chamber can be any suitable processing chamber known to the skilled artisan including, but not limited to, an atomic layer deposition (ALD) chamber, a plasma-enhanced atomic layer deposition (PEALD) chamber, a chemical vapor deposition (CVD) chamber, a plasma enhanced chemical vapor deposition (PECVD) chamber.

Some embodiments of the disclosure are directed to methods of controlling the throttle valve control system 200 for precisely controlling and optimizing pressure and flow to the purge regions (150, 155, 160, 165, 170) and the processing station 112 generally. The inputs or signals used in methods described herein can be provided by sensors or controllers of previously described embodiments; however a user can provide the inputs through a graphical user interface. The user input can be readings or measurements from a processing station or more generally a processing chamber; however the user input can also be theoretical or experimental inputs for projecting outputs. In some embodiments, the Referring now to FIG. 6A, in one or more embodiments, a method 300 for building a surrogate model-based optimizer comprises: building a simulation model 302 utilizing detailed physics and chamber geometry, collecting chamber level data 304 and, optionally, experimental data through in-built and external sensors and other metrology such as sensors described in previous embodiments, calibrating and validating simulation parameters 306 against measured data from one or more sensors, as previously described, creating design of experiments using techniques such as space filling or latin hypercube to cover optimal process space parameters 308 executing a validated simulation model 310 for the design of experiments parameters, and building a surrogate model 312 (such as a reduced order model) based on simulation data through machine learning techniques (by way of example, but not limitation: regression, gaussian kriging, response surface, etc.). In some embodiments, the method 300 optionally further comprises repeating 302 through 312 to create one or more hybrid models to predict, for example, recipe pressure settings, wafer pressure for a specified set of purge flows and/or flow settings according to either the pressure predictor surrogate model-based optimizer and/or the flow predictor surrogate model-based optimizer in accordance with one or more embodiments. As used herein, a "hybrid model" uses a combination of physics-based and experimental data. In some embodiments, a surrogate model comprises only physics-based data and a hybrid model comprises a combination of physics-based and experimental data. The hybrid model and surrogate model can be used to analyze the same parameters.

In some embodiments, the processes described in method 300, comprise the back end of the surrogate model-based optimizer in which a hybrid model is built for the surrogate model-based optimizer. In some embodiments, the process of method 300 can be packaged as a computer program product with computer executable code or a back-end system which can be a part of a recipe builder application for use by an end user on the front end. The skilled artisan will recognize that the order of operations illustrated in method 300 in FIG. 6A can be varied and should not be taken as limiting the scope of the disclosure.

Figure 6A:
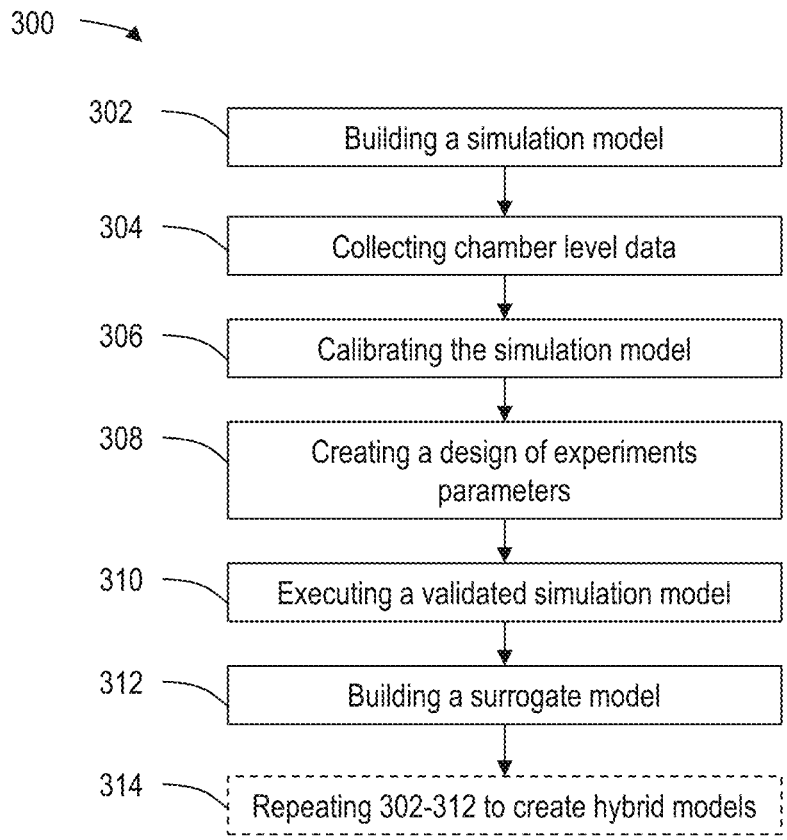
FIG. 6A shows a method of using a smart recipe builder to control and optimize a throttle valve system of a processing station in accordance with one or more embodiments of the disclosure.
Figure 6B:
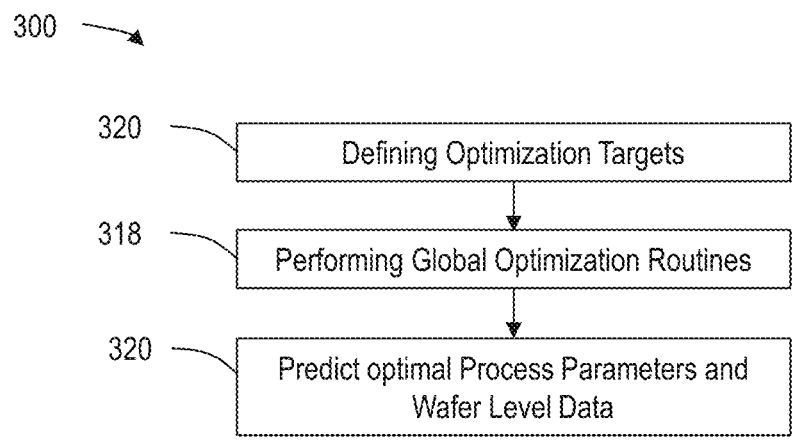
FIG. 6B shows a method of a surrogate model-based smart recipe builder according to one or more embodiment of the disclosure.

FIG. 6B shows an embodiment of method 300 which includes front-end processes. The back-end method illustrated in FIG. 6B enables an end user to select a parameter to be optimized and the surrogate model-based optimizer will provide as an output the desired parameter as specified by the end user. Furthermore, in some embodiments, the end user can provide input parameters as required by the surrogate model-based optimizer as previously described. In some embodiments, the method 300 further comprises defining optimization targets 316 (by the end user), using relevant global optimization routines for determining the ideal process parameters 318 to achieve a predetermined target. In some embodiments, the predetermined target is based on the process being used or changes to the process in use. Suitable optimization routines include, but are not limited to, DIRECT, SHGO and Simplex algorithms. In some embodiments, the predetermined target includes one or more of maximizing thickness uniformity, preventing cross-contamination and/or minimizing total flow. In some embodiments, the pressure predictor hybrid model 314 is used to predict optimal process parameters and wafer level data 320. By way of example, in some embodiments, the process predicts and determines optimal throttle valve pressure to maintain optimal flow conditions.

In some embodiments, collecting chamber level data 304 and experimental data are provided as inputs from a graphical user interface or one or more sensors, as previously described.

Figures 7, 8:
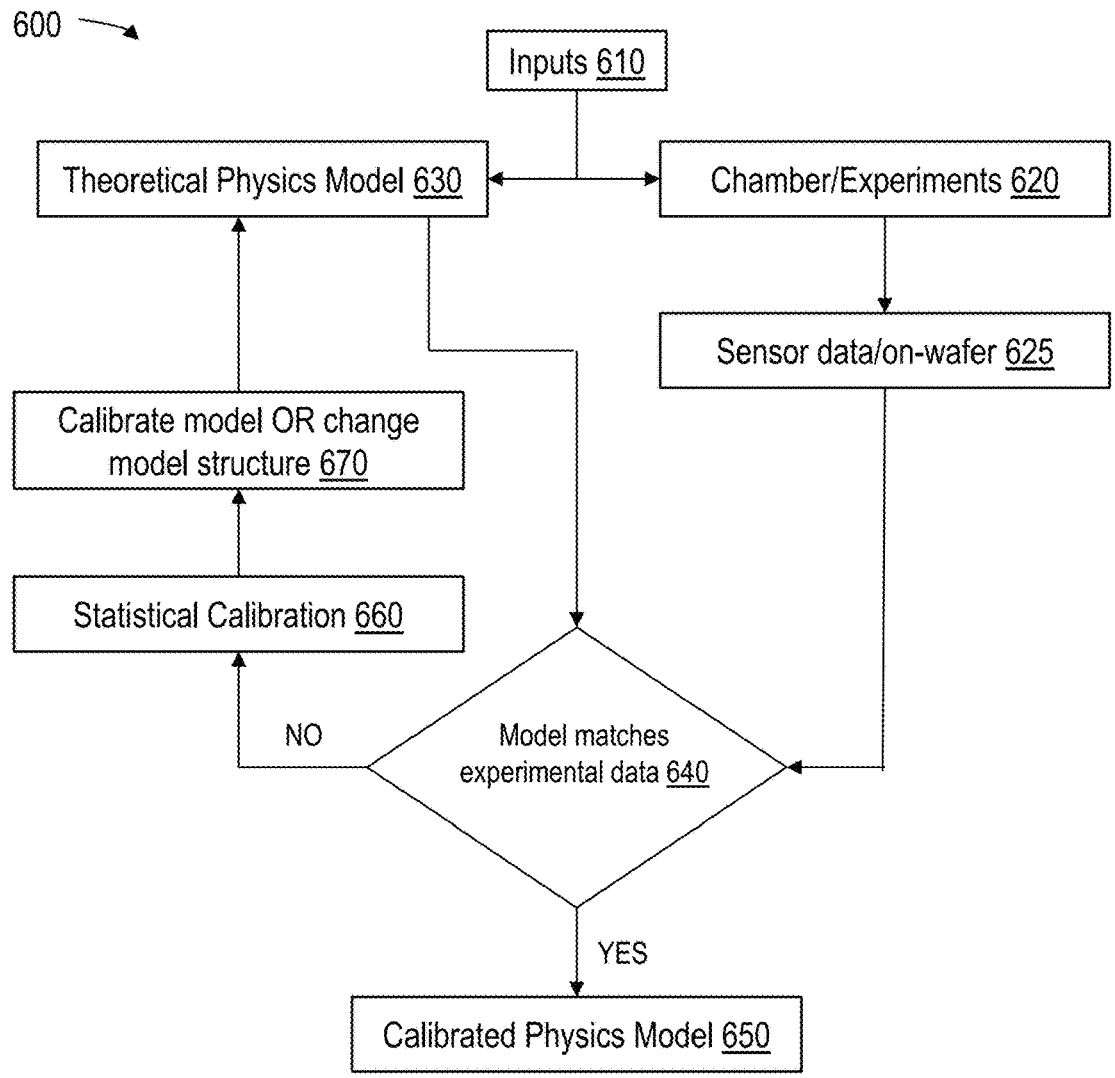
FIG. 7 illustrates an exemplary graphical user interface of the inputs for a surrogate model-based optimizer in accordance with one or more embodiment of the present disclosure.
FIG. 8 shows a first aspect of a back-end calibration process of a surrogate model-based optimizer and smart recipe builder in accordance with one or more embodiment of the present disclosure.

FIG. 7 illustrates an exemplary graphical user interface 401 with the inputs and outputs for the flow predictor surrogate model-based optimizer 400. In some embodiments, the flow predictor surrogate model-based optimizer 400 is configured to provide as outputs optimized flow rate values for non-concentric purges such as the angle purge 150, bottom purge 160 and center purge 170. In some embodiments, the flow predictor surrogate model-based optimizer 400 provides as outputs flow rate values (velocities) for the angle purge throttle valve 150v, bottom purge bottom purge throttle valve 160v and center purge throttle valve 170v. In some embodiments, the flow predictor surrogate model-based optimizer 400 provides as outputs simulated flow rate values (velocities) for the angle purge region, bottom purge region and center purge region. In some embodiments, the flow predictor surrogate model-based optimizer 400 provides as outputs a graphical plot for pressure profile at the wafer edge and a velocity profile at the wafer edge.

In some embodiments, the inputs 410 are provided by a user. In some embodiments, the inputs 410 include one or more of a station flow rate value from the station flow rate sensor 213FS, flow rate values from the heater purge flow rate sensor and/or separation purge flow rate sensor 165FS, process pressure values measured from the station pressure sensor 213PS and/or a process gap D between the substrate support 111 and the gas injector (as shown in FIG. 1). In some embodiments, the inputs 410 include common parameters from a process recipe such as the gas type, the purge gas type, the type of precursor, and flow velocity values. In some embodiments, the inputs 410 can be input or provided by a user via a graphical user interface 401 as shown in FIG. 7. In some embodiments, where inputs 410 are provided by a user, one or more non-optimized flow rates values (velocities) are inputted. In some embodiments, the inputs 410 are provided by one or more of the controllers and/or sensors described herein.

The surrogate model-based optimizer 400 is configured to provide for optimized outputs 460 to the graphical user interface. In some embodiments, the optimized outputs include an optimized the flow rate value (velocity), an optimized center purge flow rate valve (velocity) and an optimized bottom purge flow rate value (velocity). In some embodiments, the outputs can then be used to calibrate or optimize the throttle valves of the angle purge, center purge and bottom purge by controlling the angle purge throttle valve 150v, center purge throttle valve 170v and bottom purge throttle valve 160v of one or more of the previous embodiments. By calibrating the throttle valves, azimuthal non-uniformity of velocity at a substrate edge is minimized, as well as minimizing precursor diffusion outside the heater cavity and minimizing precursor dilution at wafer edge. The process or algorithm of the surrogate model-based optimizer 450 is described in further detail below.

In some embodiments, the flow predictor surrogate model-based optimizer 400 further generates as outputs via the graphical user interface 401 a pressure profile at wafer edge and a velocity profile at wafer edge. The pressure profile displays a range of pressure values at the wafer edge relative to the angular coordinates and the velocity profile displays a range of velocity values at the wafer edge relative to the angular coordinates. In such embodiments, the user can identify a desired pressure and velocity relative to the angular coordinates for any given inputs 410 as previously described. The process or algorithm of the surrogate model-based optimizer 400 is described in further detail below.

In some embodiments, the flow predictor surrogate model-based optimizer 400 is executed for a single processing station. In some embodiments, the flow predictor surrogate model-based optimizer 400 is executed for two or more processing stations of a processing chamber.

The skilled artisan will recognize that the flow predictor surrogate model-based optimizer 400 and pressure predictor surrogate model-based optimizer can be integrated into a single user-selectable interface allowing the user to decide which parameters to use. In some embodiments, the pressure predictor surrogate model-based optimizer is used to predict and determine recipe pressure setting(s) at one or more individual throttle valves for one or more processing stations in a batch processing chamber in accordance with one or more embodiments.

Utilizing a similar graphical interface to that shown in FIG. 7, the pressure predictor surrogate model-based optimizer comprises providing inputs to a surrogate model configured as a surrogate model-based optimizer and generating optimized outputs. The inputs include, but are not limited to, a station flow rate value from the station flow rate sensor 213FS and flow rate values from the heater purge flow rate sensor and separation purge flow rate sensor 165FS as well a process pressure value measured from the station pressure sensor 213PS and a process gap D between the substrate support 111 and the gas injector as shown in FIG. 1. In some embodiments, the inputs include common parameters from a process recipe such as the gas type, the purge gas type, the type of precursor, and flow velocity values. In some embodiments, the inputs can be inputted or provided by a user via a graphical user interface. In some embodiments, the inputs further include flow rate values from the angle purge 150, bottom purge 160 and center purge 170.

The surrogate model-based optimizer of some embodiments is configured to provide for optimized outputs to the graphical user interface. In some embodiments, the optimized outputs include the differential pressure between a substrate within the processing station 112 and one or more of the throttle valves and/or a recipe pressure setting of one or more throttle valves. The wafer pressure contour map is a two or three dimensional simulated model displaying the pressure across the substrate. The wafer pressure contour map is a graphical representation of the pressure across the substrate and can be used to validate wafer uniformity. In some embodiments, the recipe pressure setting of one or more of the throttle valves can then be used to calibrate one or more of the throttle valves of the embodiments described herein. The process or algorithm of the surrogate model-based optimizer is described in further detail below.

Figure 9:
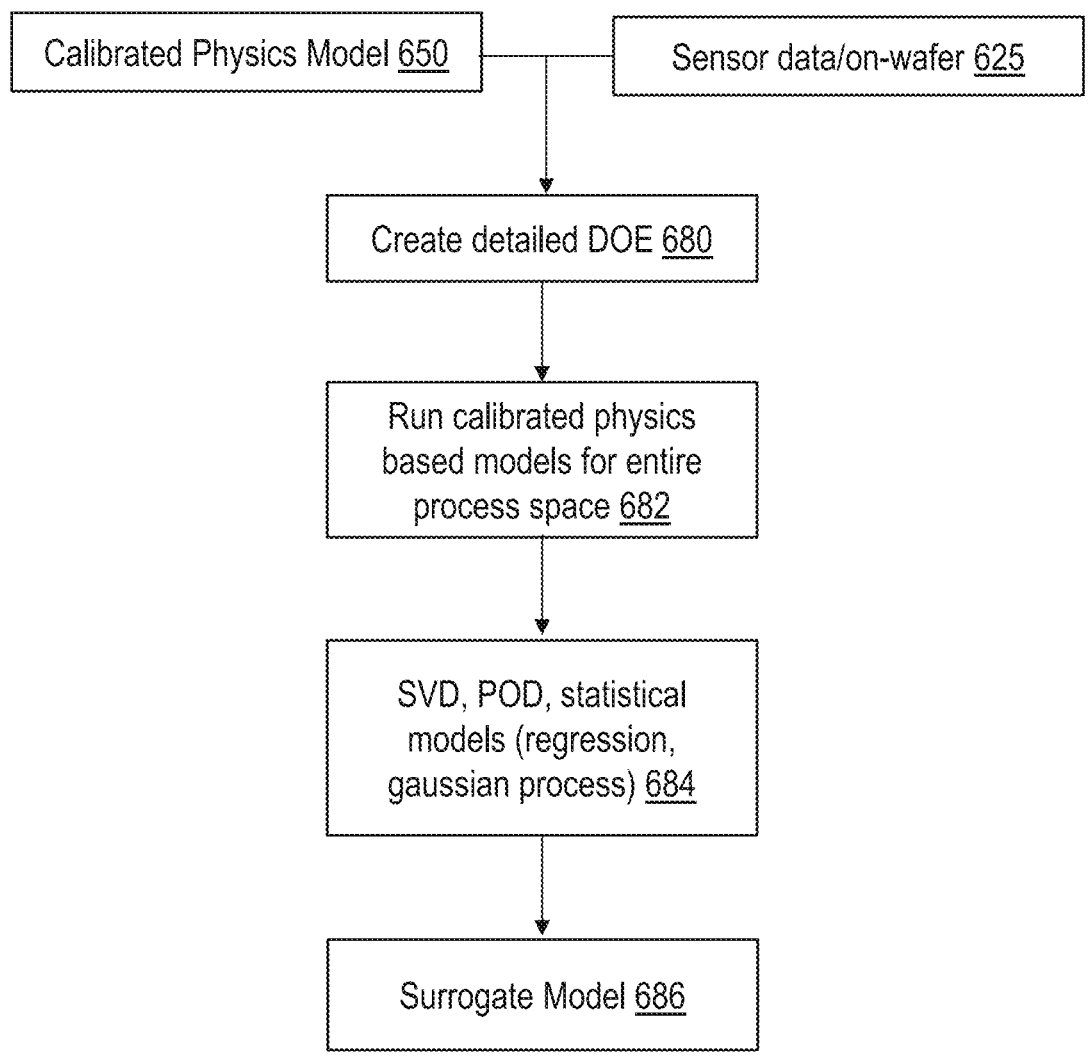
FIG. 9 shows a second aspect of a back-end calibration process of a surrogate model-based optimizer and smart recipe builder in accordance with one or more embodiment of the present disclosure.
Figure 10:
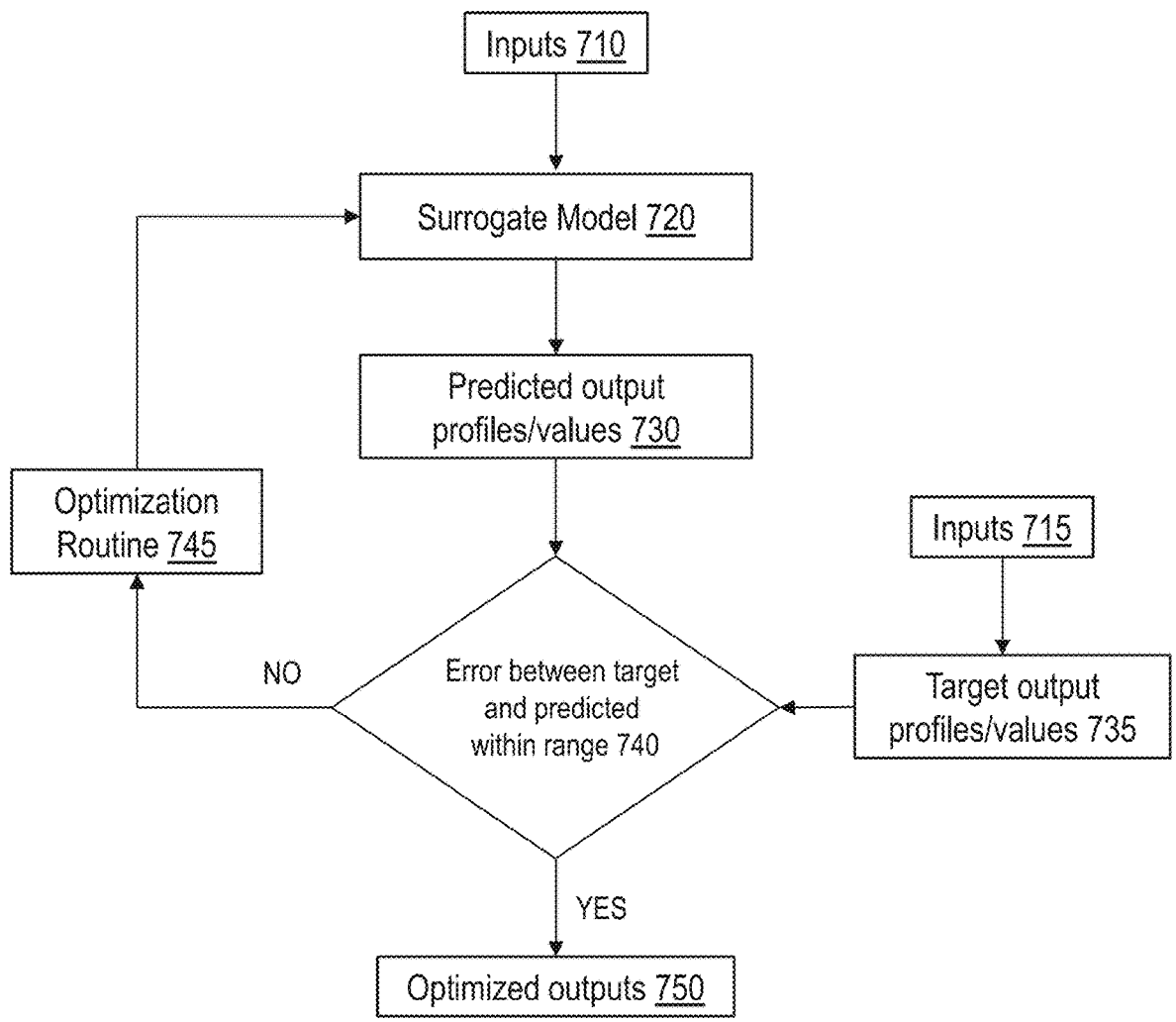
FIG. 10 shows a front-end inverse analysis and optimization process of a surrogate model-based optimizer and smart recipe builder in accordance with one or more embodiment of the present disclosure.

The surrogate model-based optimizer utilizes a simulated model represented as an aspect-oriented programming algorithm as shown in FIGS. 8-10. Referring back to the method 300 as shown in FIG. 6A, the flow chart as shown in FIG. 8 corresponds to steps 302 through 306, the flow chart as shown in FIG. 9 correlates to the steps 308 through 312. Where steps 302 through 314 and FIGS. 8 and 9 represent the back end of the surrogate model-based optimizer, FIG. 10, as explained in further detail below represents, the front end of the surrogate model-based optimizer.

FIG. 8 illustrates a calibration process 600 of the surrogate model. FIG. 9 illustrates a model reduction process 675 of the surrogate model. FIG. 10 illustrates an inverse analysis and optimization process 700 using the surrogate model on the front end.

As shown in FIG. 8, in some embodiments, the calibration process 600 of the surrogate model receives inputs 610 from a user via a graphical user interface, from one or more sensors of the previously described embodiments or a combination of inputs 610 from a user via a graphical user interface and one or more sensors of the previously described embodiments. In some embodiments, the calibration process 600 of the surrogate model receives inputs from the systems and processes as described in FIGS. 6A, 6B and 7.

The calibration process 600 compares the model data to experimental data 640. In particular the inputs 610 are compared to a data bank of chamber-specific data or experimental data 620 and a theoretical physics model 630. In some embodiments, the chamber-specific data or experimental data 620 includes substrate-specific sensor data or experimental data 625. If the chamber-specific data or experimental data 620 matches the theoretical physics model 630, the calibration process 600 generates a calibrated physics model 650 as an output. If the chamber-specific data or experimental data 620 does not match the theoretical physics model 630, the calibration process 600 performs a statistical calibration 660 to calibrate physics model parameters or to change the structure of the physics model 670, which through machine learning, updates the theoretical physics model 630. The calibration process 600 compares the updated model data to experimental data 640 and produces as an output the calibrated physics model 650.

As shown in FIG. 9, in some embodiments, the model reduction process 675 of the surrogate model includes the steps of creating a detailed Design of Experiments (DOE) map 680 by combining the calibrated physics model 650 against the substrate-specific sensor data or experimental data 625, running a calibrated physics model 682 for parameters of the processing volume, implementing data analysis for SVD, POD 684 and determining statistical models, including regression and Gaussian processes and providing as an output a surrogate model 686.

As shown in FIG. 10, in some embodiments, the inverse analysis and optimization process 700 using the surrogate model includes receiving inputs 710 from an end user and processes the inputs through a surrogate model 720. In some embodiments, the inverse analysis and optimization process receives inputs from the systems and processes as described in FIGS. 6A, 6B and 7. The inverse analysis and optimization process 700 compares the predicted surrogate model values 730 versus target values 735 and if the difference between the surrogate model values and target values is within a target range, the inverse analysis and optimization process 700 provides optimized outputs 750 to the end user through a user interface. If the difference between the surrogate model values and target values is not within a target range 740, the inverse analysis and optimization process 700 optimizes the inputs through an optimization routine 745 to reduce the error such that the difference between the surrogate model values and target values falls within the target range. The optimization routine 745 calibrates the surrogate model 720.

In some embodiments, the user is able to select which value to be optimized by providing, at the front-end, an input 715 in which one or more optimized values are selected.

Some embodiments of the disclosure are directed to computer program products comprising computer executable code that can be operated by a computing device. The computing device may be one of any form of general-purpose computer processor, microcontroller, microprocessor, etc., that can be used in an industrial setting for controlling various chambers and sub-processors.

The computing device can have a processor, a memory coupled to the processor, input/output devices coupled to the processor, and support circuits to communication between the different electronic components. The memory can include one or more of transitory memory (e.g., random access memory) and non-transitory memory (e.g., storage).

The memory, or computer-readable medium, of the processor may be one or more of readily available memory such as random access memory (RAM), read-only memory (ROM), floppy disk, hard disk, or any other form of digital storage, local or remote. The memory can retain an instruction set that is operable by the processor to control parameters and components of the system. The support circuits are coupled to the processor for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

Some embodiments of the disclosure are directed to computer program products comprising computer executable code embodied in a non-transitory computer readable medium that, when executing on one or more computing devices, performs the steps of: processing inputs through a surrogate model to generate process parameters, the surrogate model determined for a target process recipe; processing inputs through a physics-based model to generate a surrogate model; comparing the chamber-specific data with experimental data using inputs to determine a theoretical physics model; determining if the chamber-specific data or experimental data matches the theoretical physics model and generating a calibrated physics model; and calculating optimized values for one or more purge regions of a processing station.

In some embodiments, the computer program product obtains inputs from one or more of a graphical user interface, a plurality of flow rate sensors or a plurality of pressure sensors. When input is obtained from a plurality of flow rate sensors, each of the plurality of flow rate sensors are configured to measure the flow through the purge region of a processing chamber. When input is obtained from a plurality of pressure sensors, each of the plurality of pressure sensors are configured to measure the pressure in the purge region of a processing chamber.

In some embodiments, the computer program product obtains inputs from a process station flow rate sensor or a process station pressure sensor. The process station flow rate sensor or process station pressure sensor is configured to measure the flow rate or pressure through a gas supply for each processing station.

In one or more embodiments, the computer program product is configured to process a signal from one or more of the flow rate sensors or one or more of the pressure sensors through the surrogate model and to calibrate the pressure and/or flow rates to output one or more of an optimized angle purge, an optimized center purge or an optimized bottom purge.

In some embodiments, the computer program product is configured to determine a differential pressure between pressure at the surface of a substrate and one or more throttle valves or recipe pressure setting at one or more of the throttle valves to determine a substrate pressure contour map. In some embodiments, the computer program product is configured to control one or more of an angle purge throttle valve, a heater purge throttle valve, a bottom purge throttle valve, a separation purge throttle valve, a center purge throttle valve or a station flow throttle valve. In some embodiments, the optimized valve values are determined by evaluating user input.

Reference throughout this specification to "one embodiment," "certain embodiments," "various embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in various embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein provided a description with reference to particular embodiments, it is to be understood that these embodiments are merely illustrative of the principles and applications of the disclosure. It will be apparent to those skilled in the art that various modifications and variations can be made to the present disclosure without departing from the spirit and scope thereof. Thus, it is intended that the present disclosure include modifications and variations that are within the scope of the appended claims and their equivalents.

What is claimed is:

1. A method for building a surrogate model-based optimizer comprising:
    building a simulation model using one or more of a detailed physics models or chamber geometry;
    calibrating the simulation model against one or more of chamber level data or experimental data;
    calibrating simulation parameters and validating simulation parameters against measured data;
    creating design of experiment parameters to cover optimal process space parameters;
    executing a validated simulation model for the design of experiments parameters; and,
    building a surrogate model based on simulation data through machine learning techniques.

2. The method of claim 1, wherein measured data includes inputs from one or more of flow rate sensors or pressure sensors of one or more purge regions or station sensors.

3. The method of claim 2, further comprising processing a signal from one or more of the flow rate sensors or one or more of the pressure sensors through the surrogate model to calibrate one or more of pressure or flow values to output one or more of an optimized purge flow or pressure parameter for one or more purge regions.

4. The method of claim 3, further comprising processing inputs from one or more of the flow rate sensors or one or more of the pressure sensors through the surrogate model to determine one or more of pressure or flow values.

5. The method of claim 4, further comprising outputting one or more of a differential pressure between a substrate and one or more throttle valves, a recipe pressure setting at one or more of the throttle valves, or a substrate pressure contour map.

6. The method of claim 2, wherein the one or more of the flow rate sensors or the pressure sensors are connected to a sensor controller.

7. The method of claim 2, further comprising processing a signal from one or more of the flow rate sensors or one or more of the pressure sensors through the surrogate model to determine optimized purge flow parameters for one or more purge regions.

8. The method of claim 7, wherein the parameters to be optimized are determined from user input.

9. The method of claim 2, further comprising processing a signal from one or more of the flow rate sensors or one or more of the pressure sensors through the surrogate model to determine optimized purge pressure parameters for one or more purge regions.

10. The method of claim 9, wherein the parameters to be optimized are determined from user input.

11. The method of claim 1, further comprising creating a hybrid model to predict one or more of recipe pressure settings, wafer pressure for a specified set of purge flows or flow settings.

12. The method of claim 11, wherein the one or more hybrid models are used to determine throttle valve pressure to maintain optimal flow conditions of one or more purge regions.

13. A method for determining process parameters, the method comprising:

building a simulation model using one or more of a detailed physics models or chamber geometry;

calibrating the simulation model against one or more of chamber level data or experimental data;

calibrating simulation parameters and validating simulation parameters against measured data, the measured data including inputs from one or more of flow rate sensors or pressure sensors of one or more purge regions or station sensors;

creating design of experiment parameters to cover optimal process space parameters;

executing a validated simulation model for the design of experiments parameters;

building a surrogate model based on simulation data through machine learning techniques;

processing a signal from one or more of the flow rate sensors or one or more of the pressure sensors through the surrogate model to calibrate one or more of pressure or flow values to output one or more of an optimized purge flow or pressure parameter for one or more purge regions; and outputting one or more of a differential pressure between a substrate and one or more throttle valves, a recipe pressure setting at one or more of the throttle valves, or a substrate pressure contour map.

* * * * *